United States Patent
Reddy

(10) Patent No.: US 7,164,331 B2
(45) Date of Patent: Jan. 16, 2007

(54) RF CHOKE FOR CABLE SYSTEM

(75) Inventor: Prabhakara V. Reddy, The Woodlands, TX (US)

(73) Assignee: National Electronics Devices Inc, Conroe, TX (US)

( * ) Notice: Subject to any disclaimer, the term of this patent is extended or adjusted under 35 U.S.C. 154(b) by 50 days.

(21) Appl. No.: 11/027,660

(22) Filed: Dec. 30, 2004

(65) Prior Publication Data

US 2006/0148474 A1    Jul. 6, 2006

(51) Int. Cl.
*H03H 7/06* (2006.01)
(52) U.S. Cl. .................. 333/181; 333/172; 333/185; 336/212; 336/180
(58) Field of Classification Search ............... 333/181, 333/172, 185, 167; 336/212, 180
See application file for complete search history.

(56) References Cited

U.S. PATENT DOCUMENTS

| | | |
|---|---|---|
| 4,394,631 A | 7/1983 | Pavlic |
| 4,641,115 A * | 2/1987 | Bailey ..................... 333/181 |
| 5,032,808 A | 7/1991 | Reddy |
| 5,805,042 A | 9/1998 | Chastain et al. |
| 6,094,110 A | 7/2000 | Reddy |
| 6,339,364 B1 | 1/2002 | Reddy et al. |

* cited by examiner

*Primary Examiner*—Stephen E. Jones
(74) *Attorney, Agent, or Firm*—Wall Marjama & Bilinski LLP

(57) ABSTRACT

An RF choke for minimizing hum modulation in a coaxial cable system that carries broadband signals along with high amperage 60 Hz AC power signals. The choke contains two conductors wound about a rod core. The first conductor includes two groups of clockwise windings each containing three turns. The second conductor wound counterclockwise also contains two groups of winding one of which contains four turns and the other of which contains three turns. The two connectors are separated by a space of about 0.20" and a 750 ohm resistor is placed in parallel over the second group of winding in the first conductor and a second 510 ohm resistor is placed in parallel over the first group of windings in the second conductor.

14 Claims, 1 Drawing Sheet

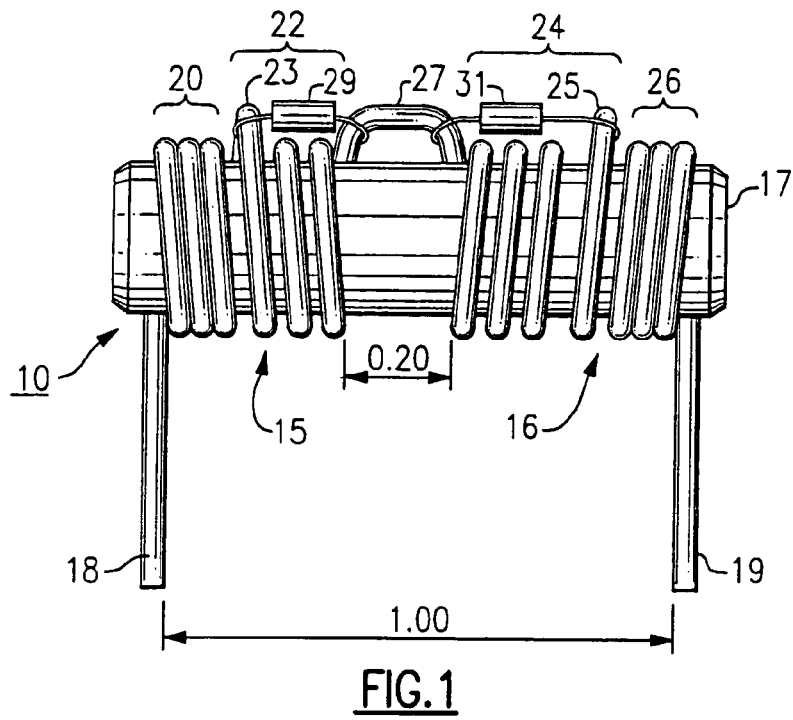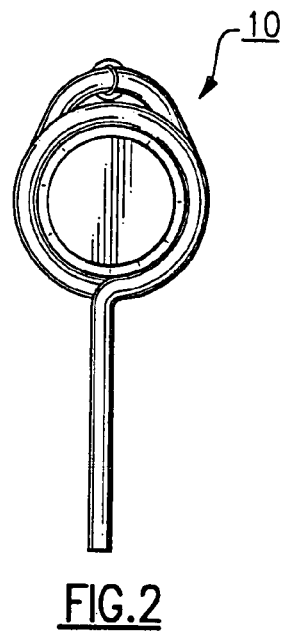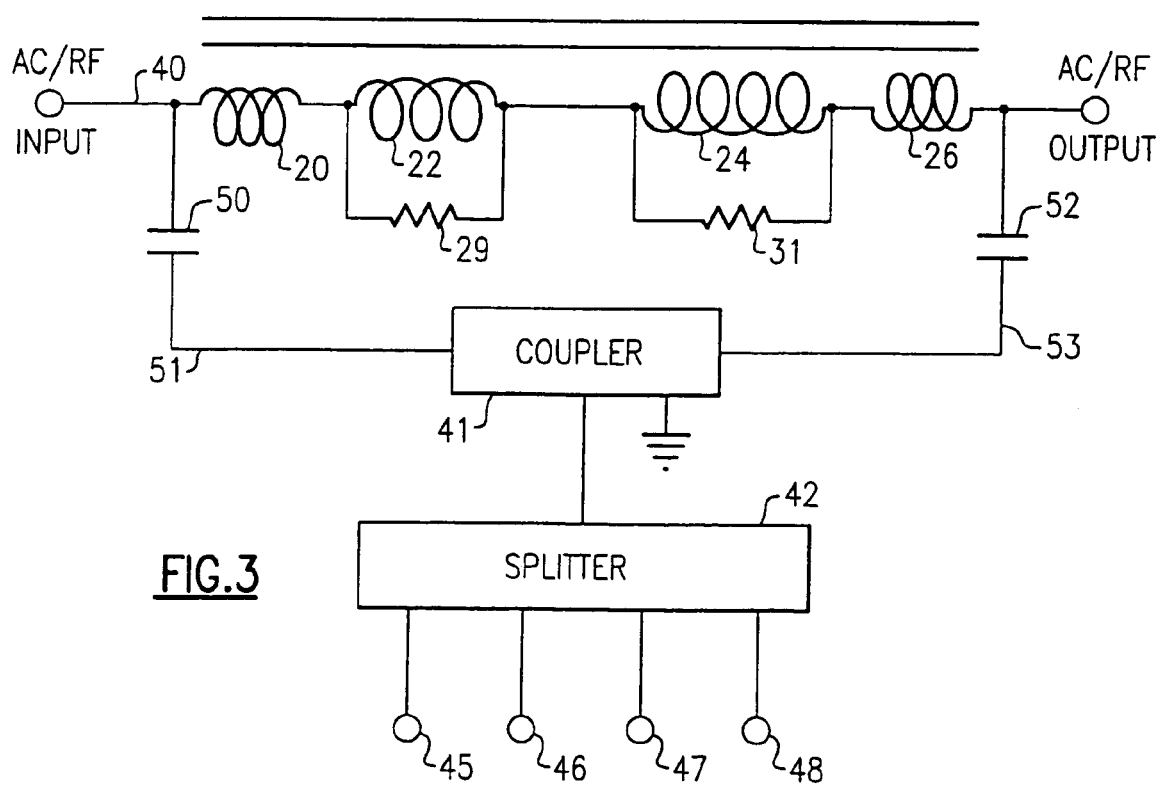

RF CHOKE FOR CABLE SYSTEM

BACKGROUND OF THE INVENTION

This invention is directed to a radio frequency (RF) choke and, in particular to a choke for separating an AC power signal from a broadband signal when both are carried together on a coaxial line.

It is common practice in the cable distribution system to utilize a broadband RF signal in the 50 to 1000 MHz range to carry a number of television channels and other information to a subscriber location and an RF signal in the 5 to 40 MHz range to carry information from the subscriber to the system distributor. An AC power signal in the 50–60 Hz is also transmitted along with the RF signal upon the same coaxial cable to provide power to system amplifiers and the like.

In CATV and telecommunication systems, RF chokes are employed for separating AC power signals from the RF signals at various locations along the cable system, so that the separated RF signal can be processed individually by RF devices such as couplers, splitters and the like. The RF chokes generally used to isolate the RF devices from the AC power signals by shunting high current AC power signals, typically in the 8 to 12 ampere range, around the RF devices. The RF choke are designed to pass the 8–12 ampere flow, and these high currents can produce hum modulations which will degrade the RF signal quality.

SUMMARY OF THE INVENTION

It is therefore a primary object of the present invention to improve cable transmission system of the type carrying both RF broadband signals and AC power signal particularly in the 8–12 ampere range upon the same cable.

It is a further object of the present invention to provide an improved RF choke for use in a CATV system.

A still further object of the present invention is to reduce the amount of hum modulation produced by an RF choke.

Another object of the present invention is to provide an RF choke which minimizes RF signal losses.

These and other objects of the present invention are attained by an improved choke that is suitable for use in a cable transmission system wherein RF broadband signals are transmitted along with AC power signals. The choke includes an elongated rod core having a first and a second group of windings, defining a first conductor that are wound in series with a third and fourth group of windings defining a second conductor. The windings in the first conductor are wound in a direction opposite to that in the second conductor to effectively cancel the flux generated in the core. The first conductor contains six turns and the second conductor contains seven turns and a space is maintained between the two conductors so that the cumulative inductance in the choke is not seriously reduced at RF signal frequencies.

BRIEF DESCRIPTION OF THE DRAWINGS

For a further understanding of these and objects of the present invention, reference will be made to the following detailed description of the invention which is to be read in association with the accompanying drawing, where:

FIG. 1 is a side elevation of an RF choke embodying the teachings of the present invention;

FIG. 2 is an end view of the choke illustrated in FIG. 1; and

FIG. 3 is a schematic view of a line splitter arrangement employing the choke of the present invention.

DETAILED DESCRIPTION OF THE INVENTION

RF choke of the type herein described generates flux across the cross section of a rod core upon which the choke is wound. The flux so generated is proportional to the product of the current flowing through the choke coil and the number of turns present in the coil. At higher current levels, the density of the flux can and often times does exceed the density at which the rod core becomes saturated. When the core becomes saturated the inductance of the choke and thus its impedance becomes substantially reduced. In the event a 60 Hz power signal at a relatively high amperage in the 8–12 amp range flows through the RF choke, the core will become saturated when the AC current reaches its peak value or in other words at a rate of 120 times a second. This repetitive change in impedance, in turn, produces a modulation in the RF signal which is at the same rate. This phenomenon, which is called the hum modulation, is cumulative in nature and produces a serious degradation in the RF broadband signals if left unchecked.

As will be explained in greater detail below, the hum modulation in the choke of the present invention is minimized by the use of two separate conductors that are wound in different directions upon a common rod core. The core is fabricated of a nickel zinc ferrite composition, although other suitable core materials having similar properties can be used in the practice of the present invention. The number of turns in each conductor is minimized, with the turns in each conductor being about equal. As a result, the lines of flux that are generated in the core at AC signal frequencies are about equal and opposite thus substantially reducing the harmful effects of the lines of flux. Furthermore, the physical positioning of the two conductors relative to each other on the rod core is such that the cumulative inductance at radio frequencies is not substantially reduced.

Turning now to FIGS. 1 and 2, there is illustrated a radio frequency choke generally referenced 10 that embodies the teachings of the present invention. The choke includes a pair of conductors 15 and 16 that are wound upon a rod core 17 having an outside diameter of about 0.180" and a length of about 1.10". The two conductors, as well as the input terminal 18 and the output terminal 19 are formed from a single piece of number 17 gage wire having about a 0.05" diameter. However, the coils can be wound separately and solder together without departing from the teachings of the present invention.

The first conductor 15 includes a first group of windings 20 that has three clockwise turns that are contiguously disposed. The first group of windings are connected in series with a second group of windings 22 that includes three clockwise turns which are non-contiguously disposed. The two groups of windings are separated by a space of about 0.015". The first turn in the second group of windings contains a raised loop 23. The input terminal 18 of the choke is integrally joined to the first turn of the first group of windings.

The second conductor 16 contains a third group of counterclockwise windings 24 that includes four non-contiguously disposed turns. The last turn in the third group also contains a raised loop 25. The second and third group of windings are integrally joined by a straight run of wire 27 which provides separation between the two conductors of about 0.20". A first resistor 29 having a resistance of about 750 ohms is connected in parallel over the second group of windings between the raised loop 23 and the straight run of wire 27. A second resistor 31 having a resistance of about 510 ohms is also placed in parallel over the third group of windings between the raised loop 25 and the straight run of wire that separates the two conductors.

A fourth group of windings 26 is contained in the second conductor is connected in series with the third group of windings. Here again, the winding in the fourth group are wound counterclockwise and are contiguously disposed. The fourth group of windings contains three turns. A space of about 0.015" is provided between the third and fourth group of windings. The output terminal 19 is integrally joined to the last turn of the fourth group of windings. The distance between the two terminals is about 1.00".

Turning now to FIG. 3, the choke 10 of the present invention is shown mounted in series with a coaxial cable 40 and in parallel over a coupler 41. The coupler, in turn, is connected to a splitter 42 which provide broadband signals to a number of subscriber locations 45–48. A first capacitor 50 for blocking DC as well as most of the 60 Hz AC is mounted in the input line 51 to the coupler. A second similar capacitor 52 is mounted in the output line 53 of the coupler. The capacitors will freely pass the low amperage broadband signals from the coaxial cable to the coupler.

As noted above, the 60 Hz AC current that is flowing through the choke at between 8–12 amperes can produce hum modulation in the RF signal thereby degrading the broadband signal. This hum modulation is effectively minimized by the present choke due to fact that the windings of the two conductors are in opposite directions so that the lines of flux that are generated by the winding are about equal and opposite and thus cancel each other and by maintaining a separation between the conductors such that their cumulative inductance at RF frequencies does not get seriously reduced.

While the present invention has been particularly shown and described with reference to the preferred mode as illustrated in the drawing, it will be understood by one skilled in the art that various changes in detail may be effected therein without departing from the spirit and scope of the invention as defined by the claims.

I claim:

1. An RF choke that includes:
   an elongated core;
   a first group of windings and a second group of windings mounted in series upon said core, said first and second groups of windings defining a first conductor containing six turns;
   a first resistor mounted in parallel over the second group of windings;
   a third group of windings and a fourth group of windings mounted in series upon said core, said third and fourth group of windings defining a second conductor containing seven turns;
   a second resistor connected in parallel over the third group of windings;
   said windings in the first conductor being wound in a direction opposite to the windings in the second conductor; and
   said first and second conductors being connected in series and being separated by a given distance such that the inductance at RF frequencies is not substantially reduced and wherein each of said second and third groups of windings are non-contiguously wound.

2. The choke of claim 1 wherein the core is fabricated of a nickel zinc ferrite composition.

3. The choke of claim 1 wherein the windings in the first and the fourth group of windings are contiguously wound.

4. The choke of claim 3 wherein the first turn of the second group of windings form a first raised loop and the last turn of the third group of windings forms a second raised loop.

5. The choke of claim 4 wherein the last turn of the second group of windings and the first turn of the third group of windings are integrally jointed by a run of wire that spans said space between the second and third groups of windings.

6. The choke of claim 5 wherein said first resistor is connected in parallel over the second group of windings between said first raised loop and said run.

7. The choke of claim 6 wherein said second resistor is connected in parallel over the third group of windings between said run and said second raised loop.

8. The choke of claim 7 wherein said first, second and fourth group of winding have the same number of turns and the third group of windings has at least one additional turn.

9. The choke of claim 8 wherein said first, second and fourth groups of windings each have three turns and the third group of windings has four turns.

10. The choke of claim 7 wherein said first resistor has a resistance of about 750 ohms and second resistance of about 510 ohms.

11. The choke of claim 10 wherein the space between the second and the third group of windings is about 0.20 inches.

12. The choke of claim 11 that further includes a space of about 0.015 inches separates the windings of the first and second groups of windings and the third and fourth groups of windings.

13. The choke of claim 12 wherein the outside diameter of the core is about 0.180 inches.

14. The choke of claim 13 that further includes input terminal lead that is integrally joined to the first turn of the first group of windings and an output terminal lead that is integrally joined to the last turn of the fourth group of windings.

* * * * *